United States Patent
Itou

(10) Patent No.: US 8,934,623 B2
(45) Date of Patent: Jan. 13, 2015

(54) HOUSING FOR ELECTRONIC DEVICE

(75) Inventor: Takeshi Itou, Kanagawa (JP)

(73) Assignee: NEC Casio Mobile Communications Ltd., Kanagawa (JP)

( * ) Notice: Subject to any disclaimer, the term of this patent is extended or adjusted under 35 U.S.C. 154(b) by 0 days.

(21) Appl. No.: 13/824,886

(22) PCT Filed: Sep. 13, 2011

(86) PCT No.: PCT/JP2011/070795
§ 371 (c)(1),
(2), (4) Date: Mar. 18, 2013

(87) PCT Pub. No.: WO2012/049930
PCT Pub. Date: Apr. 19, 2012

(65) Prior Publication Data
US 2013/0175910 A1    Jul. 11, 2013

(30) Foreign Application Priority Data

Oct. 12, 2010    (JP) ................. 2010-229724

(51) Int. Cl.
| H04M 1/00 | (2006.01) |
| H04M 9/00 | (2006.01) |
| H05K 5/06 | (2006.01) |
| H04M 1/18 | (2006.01) |
| G06F 1/16 | (2006.01) |
(Continued)

(52) U.S. Cl.
CPC ............. H05K 5/069 (2013.01); H04M 1/18 (2013.01); G06F 1/1656 (2013.01); H04M 1/0249 (2013.01); H04M 1/0214 (2013.01); H04M 1/23 (2013.01)
USPC .......................................... 379/422; 379/437

(58) Field of Classification Search
CPC ... H04M 1/0214; H04M 1/18; H04M 1/0249; H05K 5/069; G06F 1/1656
USPC .......... 379/419, 422, 428.01, 433.11, 433.13, 379/437; 455/571.1, 575.3, 575.8; 361/679.01, 679.56
See application file for complete search history.

(56) References Cited

U.S. PATENT DOCUMENTS

| 2003/0094101 A1 | 5/2003 | Hara et al. |
| 2006/0258325 A1 | 11/2006 | Tsutaichi et al. |

FOREIGN PATENT DOCUMENTS

| CN | 101179614 A | 5/2008 |
| CN | 201083940 Y | 7/2008 |
| DE | 102007009816 A1 | 9/2008 |

(Continued)

OTHER PUBLICATIONS

Extended European Search Report dated Jun. 3, 2014, issued by the European Patent Office in corresponding European Application No. 11832369.0.

(Continued)

*Primary Examiner* — Tuan D Nguyen
(74) *Attorney, Agent, or Firm* — Sughrue Mion, PLLC

(57) ABSTRACT

A housing includes: main body 10 that includes a bottom portion and a side wall rising from the bottom portion; lid member 20 that is mounted on the inside of the side wall of main body 10; waterproof sealant 60 that is deposited between lid member 20 and main body 10 to seal a gap between lid member 20 and main body 10; and an operation section that is provided on lid member 20, wherein a peripheral edge of the operation section and a surface of lid member 20 are joined together with waterproof tape 70.

14 Claims, 5 Drawing Sheets

(51) Int. Cl.
*H04M 1/02* (2006.01)
*H04M 1/23* (2006.01)

(56) References Cited

FOREIGN PATENT DOCUMENTS

| JP | 59-155781 U | 10/1984 |
|---|---|---|
| JP | 6-70291 U | 9/1994 |
| JP | 2001-274565 A | 10/2001 |
| JP | 2003-133752 A | 5/2003 |
| JP | 2003-152347 A | 5/2003 |
| JP | 2003-163342 A | 6/2003 |
| JP | 2003-533055 A | 11/2003 |
| JP | 2003-347756 A | 12/2003 |
| JP | 2005-209868 A | 8/2005 |
| JP | 2005-290897 A | 10/2005 |
| JP | 2006-511924 A | 4/2006 |
| JP | 2006-319855 A | 11/2006 |
| JP | 2009-267895 A | 11/2009 |

OTHER PUBLICATIONS

Communication dated Nov. 4, 2014, issued by the State Intellectual Property Office of the People's Republic of China in counterpart Application No. 2011800486705.

HOUSING FOR ELECTRONIC DEVICE

CROSS REFERENCE TO RELATED APPLICATIONS

This application is a National Stage of International Application No. PCT/JP2011/070795 filed Sep. 13, 2011, claiming priority based on Japanese Patent Application No. 2010-229724 filed Oct. 12, 2010, the contents of all of which are incorporated herein by reference in their entirety.

TECHNICAL FIELD

The present invention relates to a housing for various electronic devices such as a mobile phone, a PDA (Personal Data Assistance), and a PC (personal computer), and more particularly, to a waterproof structure for the housing.

BACKGROUND ART

Most housings for electronic devices include a lower cover and an upper cover that faces each other. In recent years, the housings for electronic devices are mostly provided with a waterproof structure. Specifically, an elastic seal member is arranged between the lower cover and the upper cover. More specifically, the elastic seal member is arranged between a side wall end surface of the lower cover and a side wall end surface of the upper cover. The seal member is sandwiched and compressed between the side wall end surfaces that face each other to prevent liquid from entering the housing.

CITATION LIST

Patent Literature

Patent Literature 1: JP 2003-347756 A

SUMMARY OF INVENTION

Technical Problem

Since the above seal member is sandwiched between the side wall end surfaces, that face each other, of the two covers, the size (width and thickness) of the seal member is limited in relation to the width and the flatness of the side wall end surface. That is, if the seal member has a larger width than the width of the side wall end surface, the seal member protrudes from the housing. Meanwhile, if the width of the seal member is much smaller than the width of the side wall end surface, the seal member may be stretched or may collapse when sandwiched between the side wall end surfaces that face each other. When the seal member is stretched or collapses, a predetermined compression state cannot be obtained, and the waterproof function is deteriorated.

In a case in which the seal member has a thickness of 1.0 mm, a compression rate of 30% to 50% is obtained by compressing the seal member to a thickness of 0.3 mm to 0.5 mm. However, in a case in which the seal member has a thickness of 0.5 mm, the seal member needs to be compressed to a thickness of 0.15 mm to 0.25 mm so as to obtain the same compression rate. Thus, if there is a projected or recessed portion having a height of 0.15 mm or more on the side wall end surfaces of the covers that sandwich the seal member, the seal member is incompletely compressed.

For the above reason, the seal member is required to be a certain size or larger, and as a result, the side walls of the lower cover and the upper cover have a larger thickness. However, as the thickness of the side walls of the covers increases, the volume of the housing decreases. That is, the mounting space within the housing is reduced. It is thus necessary to reduce the number of mounted components at the expense of the function or performance of the electronic device. Alternatively, it is necessary to excessively increase the mounting density.

It is an object of the present invention to provide a housing for electronic devices which is provided with a sufficient waterproof function and mounting space equal to or larger than that of a housing that lacks a waterproof function.

Solution to Problem

A housing for electronic devices according to one aspect of the present invention includes: a main body that includes a bottom portion and a side wall rising from the bottom portion; a lid member that is mounted on the inside of the side wall of said main body; a waterproof sealant that is deposited between said lid member and said main body to seal a gap between said lid member and said main body; and an operation section that is provided on said lid member, wherein a peripheral edge of said operation section and a surface of said lid member are joined together with a waterproof tape.

A housing for electronic devices according to another aspect of the present invention includes: a main body that includes a bottom portion and a side wall rising from the bottom portion; a lid member that is mounted on the inside of the side wall of said main body; a waterproof sealant that is deposited between said lid member and said main body to seal a gap between said lid member and said main body; and an operation section that is provided on said lid member, wherein a peripheral edge of said operation section and a surface of said lid member are joined together with said waterproof sealant.

Advantageous Effects of Invention

The present invention achieves a housing for electronic devices which is provided with a sufficient waterproof function and a mounting space equal to or larger than that of a housing that lacks a waterproof function.

DESCRIPTION OF EMBODIMENTS

Figure 1:
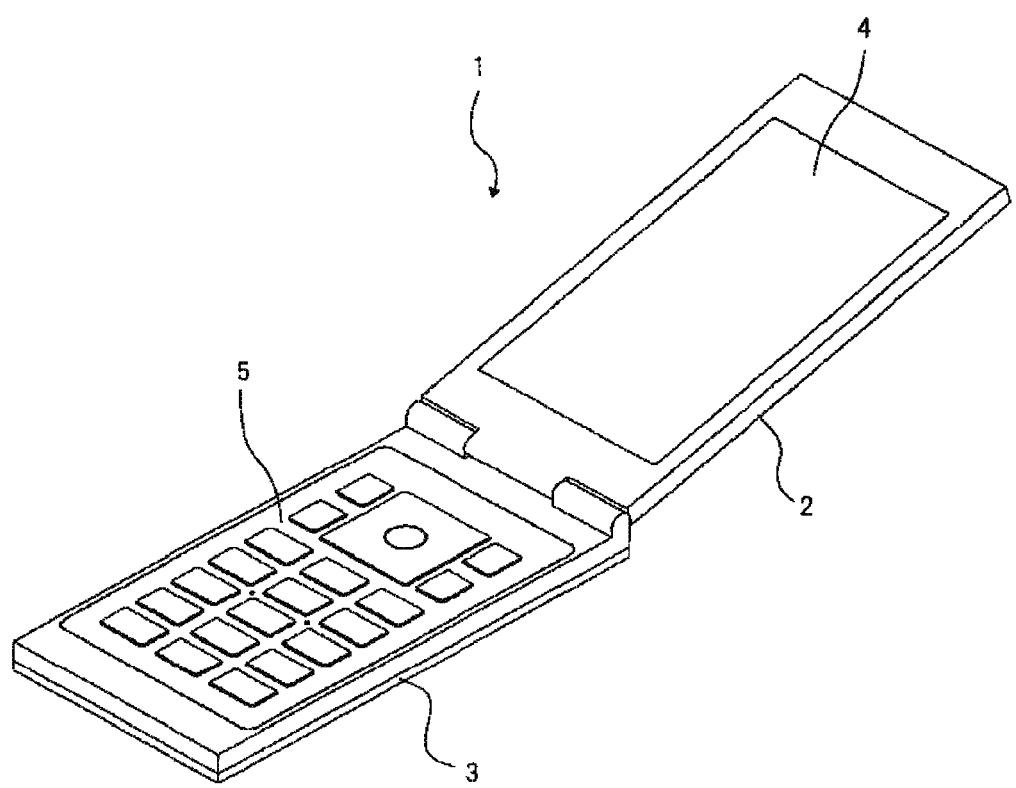
FIG. 1 is a perspective view of a mobile phone to which the present invention is applied.

Hereinafter, a first exemplary embodiment of the present invention will be described. FIG. 1 is a perspective view of a mobile phone according to this exemplary embodiment. Mobile phone 1 shown in the drawing includes upper housing 2 and lower housing 3 rotatably coupled together. Liquid crystal panel 4 as a display is provided on a front surface of upper housing 2. Key sheet 5 as an operation section is arranged on a front surface of lower housing 3. Upper housing 2 and lower housing 3 can be shifted from a closed state in which the front surfaces face each other to an open state shown in FIG. 1 and vice versa by a rotational operation.

Figure 2:
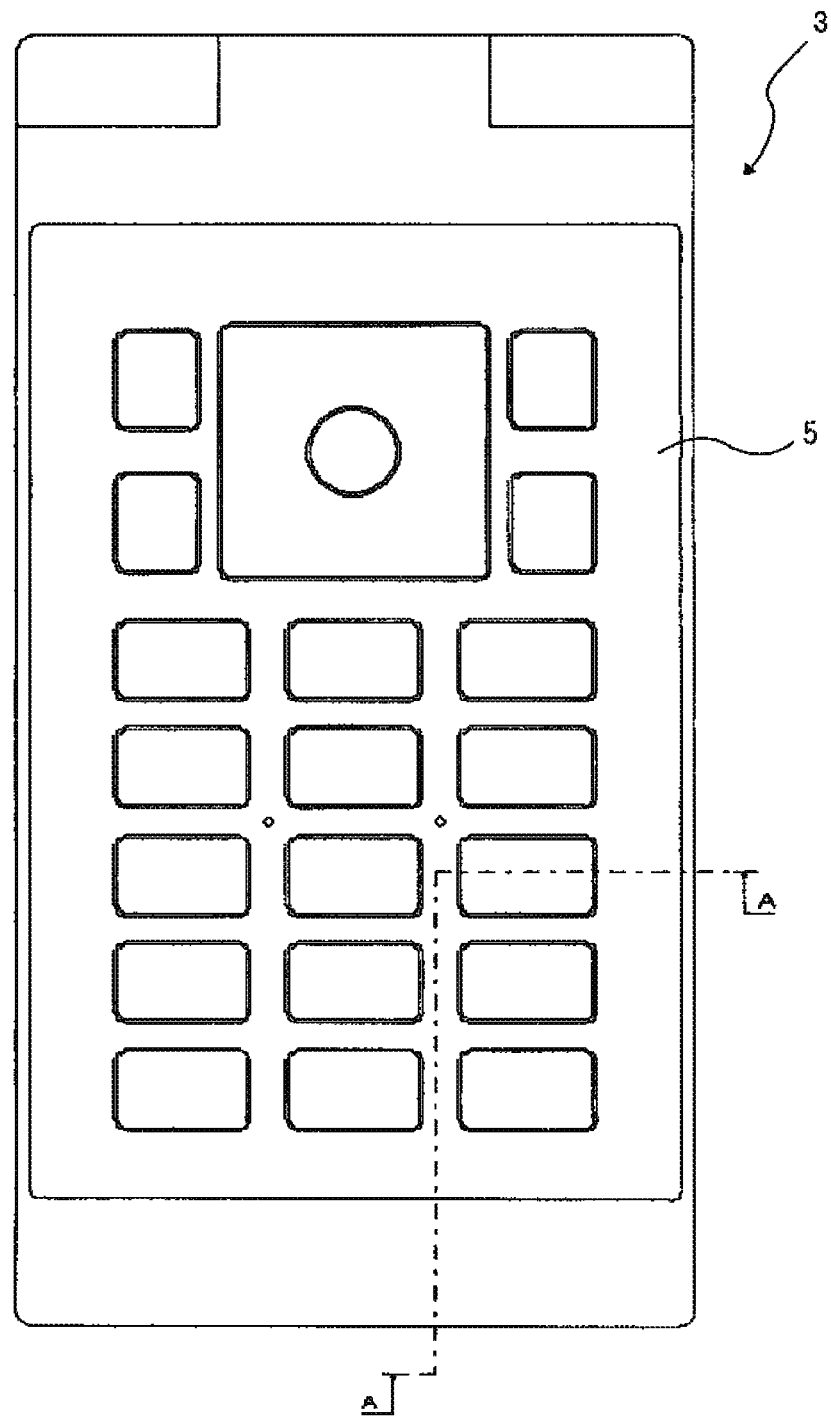
FIG. 2 is a plan view of a lower housing shown in FIG. 1.
Figure 3:
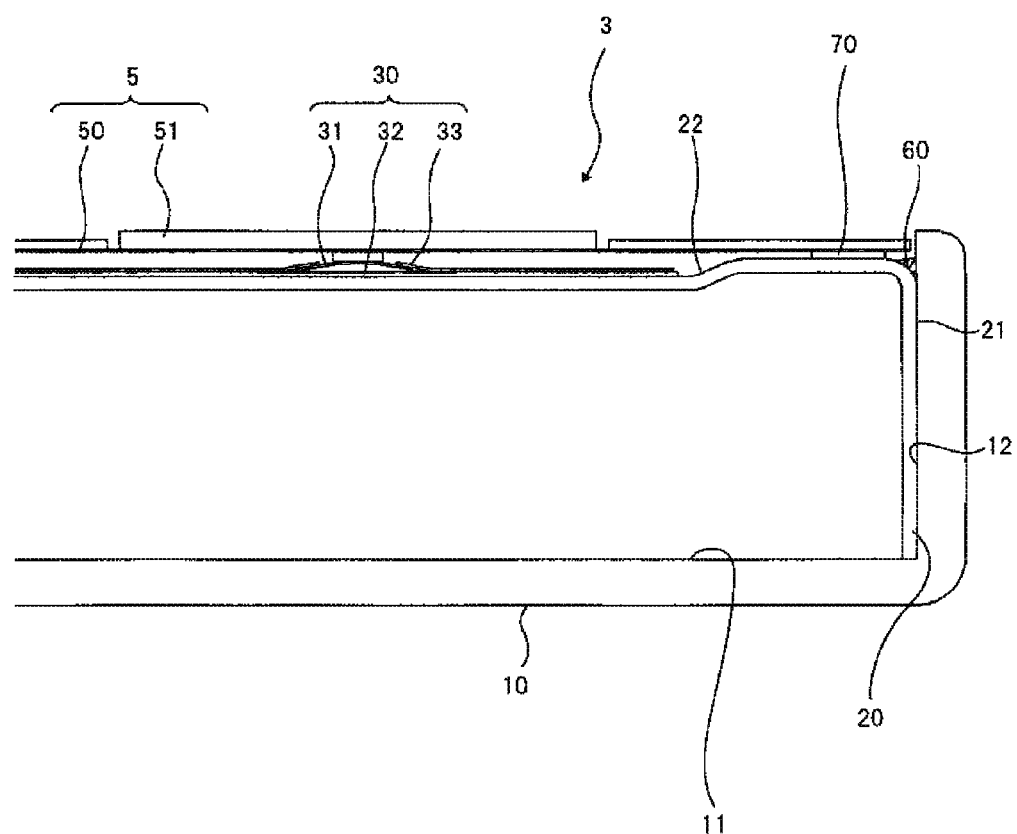
FIG. 3 is a sectional view of the lower housing taken along A-A in FIG. 2.

FIG. 2 is an enlarged plan view of the front surface of lower housing 3. FIG. 3 is a sectional view of lower housing 3 taken along A-A in FIG. 2. As shown in FIG. 3, lower housing 3 includes main body 10 and lid member 20. Main body 10 and lid member 20 each include a bottom portion, and a side wall that rises substantially perpendicularly from each side of the bottom portion. In other words, main body 10 and lid member 20 each have a substantially box-like shape with an opening portion at one surface. Main body 10 is formed of engineering plastic such as polycarbonate. Meanwhile, lid member 20 is formed of press-formed stainless steel plate.

As shown in FIG. 3, lid member 20 is fitted into main body 10 to close the opening portion of main body 10. To be more specific, lid member 20 is fitted into main body 10 such that the opening portion thereof overlaps with bottom portion inner surface 11 of main body 10. Side wall outer surface 21 of lid member 20 is in contact with side wall inner surface 12 of main body 10 with almost no gap therebetween. Necessary components (not shown) such as a battery and a circuit board are mounted within main body 10 before lid member 20 is fitted into main body 10. That is, the necessary components mounted within main body 10 are covered with lid member 20.

In this case, metal lid member 20 that is arranged within plastic main body 10 with almost no gap therebetween functions to improve the entire strength of the lower housing.

Switch circuit 30 and key sheet 5 are arranged in this order on bottom portion outer surface 22 of lid member 20. Switch circuit 30 is FPC (Flexible Printed Circuits) including contact member 31, electrical contact 32, and holding sheet 33. Contact member 31 faces electrical contact 32, and is fixed by holding sheet 33.

Key sheet 5 includes sheet-like base material 50 having flexibility, and operation button 51 arranged on base material 50. When operation button 51 of key sheet 5 is pressed, base material 50 is deflected. Contact member 31 of switch circuit 30 located below key sheet 5 is thereby deformed to come into contact with electrical contact 32, so that contact member 31 and electrical contact 32 are brought into electrical contact with each other. In addition to improving the entire strength of the lower housing, lid member 20 functions to receive pressure caused when operation button 51 is pressed.

As shown in FIG. 3, waterproof sealant 60 is deposited between lid member 20 and main body 10 along an outer periphery of the bottom portion of lid member 20. To be more specific, waterproof sealant 60 is deposited between a corner portion of lid member 20 and side wall inner surface 12 of main body 10. Accordingly, liquid is prevented from entering the gap between lid member 20 and main body 10. The term "corner portion" of lid member 20 as used herein means a border portion between the bottom portion and the side wall of lid member 20. An air pulse dispenser may be used to deposit waterproof sealant 60. Examples of waterproof sealant 60 include waterproof resins such as a silicone-based versatile sealant material, an elastic adhesive, and an acrylic sealing agent. Waterproof sealant 60 is adhered to lid member 20 and main body 10 by its adhesive force. Thus, waterproof sealant 60 is deformed when lid member 20 and main body 10 are deformed, thereby maintaining the waterproof property. Meanwhile, a seal member used in conventional products is sandwiched between upper and lower covers, but does not adhere to the covers. Thus, when the upper and lower covers are deformed, the compression amount of the seal member may be partially changed to deteriorate the waterproof property.

Referring again to FIG. 3, a peripheral edge of key sheet 5 is joined to bottom portion outer surface 22 of lid member 20 with waterproof tape 70. Accordingly, liquid is prevented from entering the space between key sheet 5 and switch circuit 30. The peripheral edge of key sheet 5 may also be fixed to the side wall end surface of main body 10. However, to fix the peripheral edge of key sheet 5 to the side wall end surface of main body 10, the side wall end surface needs to be a certain width or wider. For this reason, the peripheral edge of key sheet 5 is fixed to bottom portion outer surface 22 of lid member 20, so that the width of the side wall end surface of main body 10 can be reduced. In other words, the side wall of main body 10 can be made thinner to increase the volume of lower housing 3.

An opening portion (not shown) may be formed in main body 10 or lid member 20 for the purpose of attaching an battery cover (not shown) or an I/O cover (not shown). In this case, the opening portion can be made waterproof by a structure or a method similar to a conventional structure or method.

Figure 4:
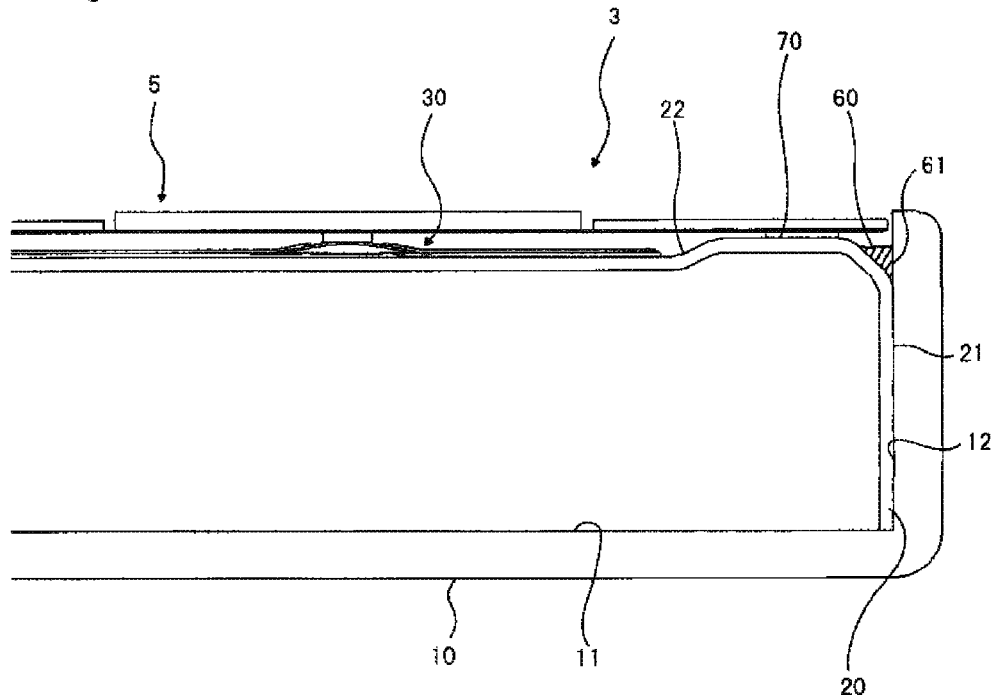
FIG. 4 is a sectional view illustrating one modification of the mobile phone shown in FIG. 1.

As shown in FIG. 4, fluid reservoir 61, i.e., gathering 61 may be formed by deforming the corner portion of lid member 20 toward the inside of lid member 20. A larger amount of waterproof sealant 60 can be deposited by forming fluid reservoir 61. If a machine is used to deposit waterproof sealant 60, it is more difficult to stably deposit a smaller amount of waterproof sealant 60. For this reason, fluid reservoir 61 as shown in Figure is formed, so that waterproof sealant 60 can be stably deposited even if a machine is used. To be more specific, waterproof sealant 60 is prevented from sticking out and flowing out. Waterproof sealant 60 may also be manually deposited. However, when waterproof sealant 60 is automatically deposited by using a machine, effects such as reducing the manufacturing time, stabilizing the quality, and reducing the manufacturing cost, can be obtained.

Figure 5:
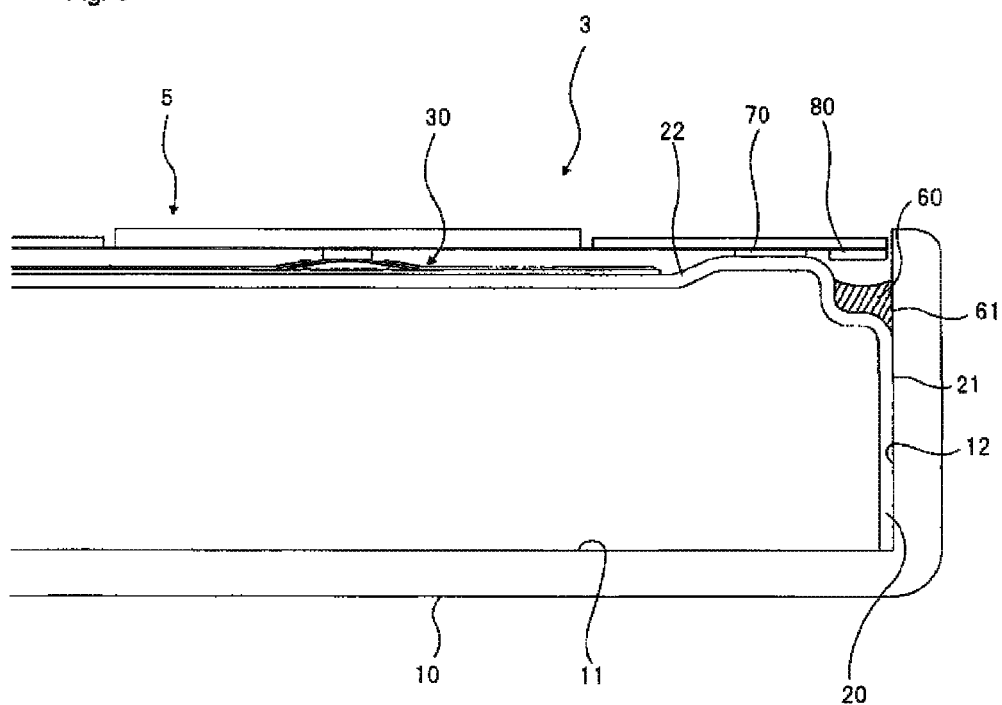
FIG. 5 is a sectional view illustrating another modification of the mobile phone shown in FIG. 1.

In the case in which fluid reservoir 61 as described above is formed, the end portion of key sheet 5 may be turned up or depressed. To solve the problem, as shown in FIG. 5, frame-like reinforcement plate 80 is preferably arranged between the end portion of key sheet 5 and lid member 20.

Figure 6:
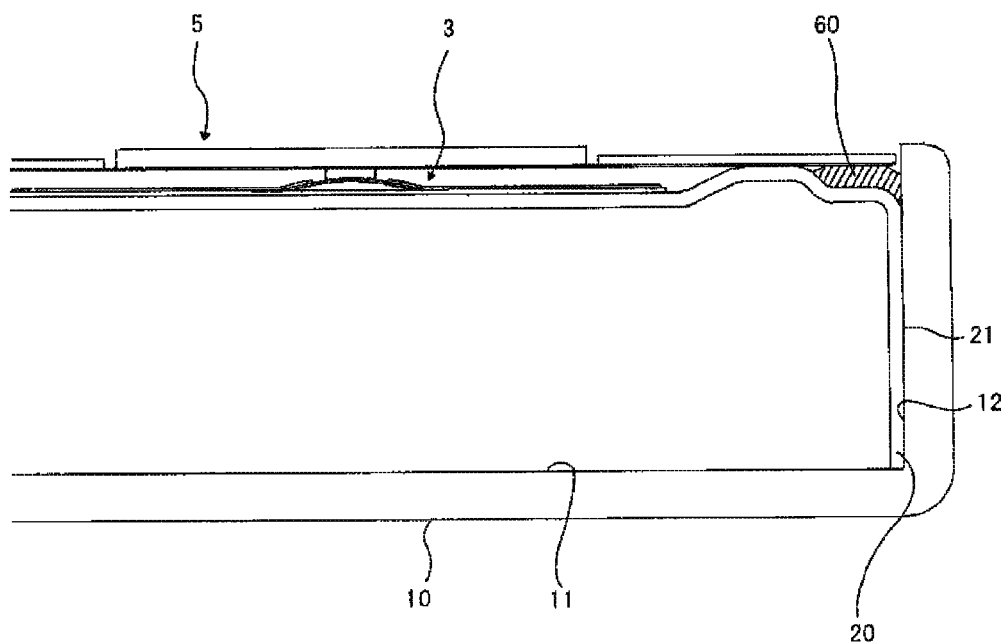
FIG. 6 is a sectional view illustrating another modification of the mobile phone shown in FIG. 1.

As shown in FIG. 6, lid member 20 and key sheet 5 may be joined together with waterproof sealant 60. In this case, waterproof tape 70 shown in FIG. 3 is not required, thereby reducing the cost.

Figure 7:
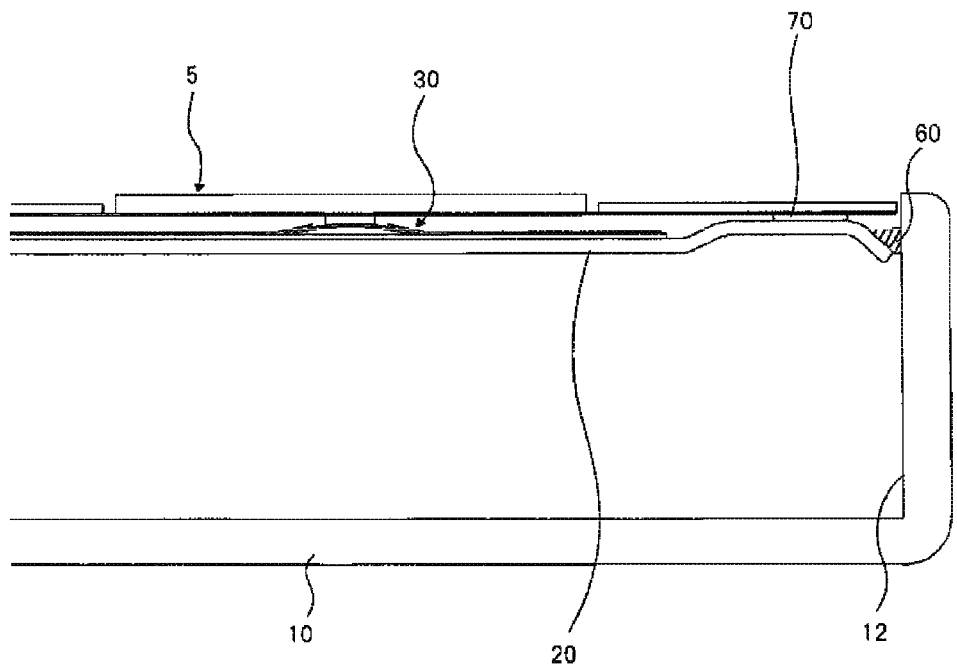
FIG. 7 is a sectional view illustrating another modification of the mobile phone shown in FIG. 1.

As shown in FIG. 7, when a gap is generated between lid member 20 and side wall inner surface 12 of main body 10, waterproof sealant 60 having thixotropy is used. Waterproof sealant 60 can thereby be prevented from flowing into main body 10.

The present application is based upon and claims the benefit of priority from Japanese Patent Application No. 2010-229724 filed on Oct. 12, 2010, the disclosure of which is incorporated herein in its entirety by reference.

The invention claimed is:

1. A housing for portable communication devices comprising:
a main body comprising a bottom portion and a side wall rising from the bottom portion;
a lid member comprising a plate-like bottom portion that is mounted on the inside of the side wall of said main body so that the bottom portion of said lid member closes an opening portion of said main body;
a waterproof sealant that is deposited between said lid member and said main body to seal a gap between an outer periphery of the bottom portion of said lid member and the side wall of said main body; and an operation section that is provided on said lid member,
wherein a peripheral edge of said operation section and a surface of the bottom portion of said lid member are joined together with a waterproof tape.

2. The housing for portable communication devices according to claim 1, wherein said lid member is formed of a metal plate.

3. The housing for portable communication devices according to claim 1, wherein:
said lid member comprises the bottom portion and a side wall rising from the bottom portion; and
said waterproof sealant is deposited along a corner portion between the bottom portion and the side wall of said lid member.

4. The housing for portable communication devices according to claim 1, wherein a fluid reservoir in which said waterproof sealant is deposited is formed between said lid member and said main body.

5. The housing for portable communication devices according to claim 1, wherein:
said operation section comprises a switch circuit provided on said lid member, and a flexible sheet laminated on the switch circuit; and
a peripheral edge of the flexible sheet extending outward of the switch circuit is joined to the surface of the bottom portion said lid member.

6. The housing for portable communication devices according to claim 5, comprising a frame-like reinforcement member that is arranged between the flexible sheet and the surface of the bottom portion of said lid member.

7. The housing for portable communication devices according to claim 1, wherein said waterproof sealant has thixotropy.

8. A housing for portable communication devices comprising:
a main body comprising a bottom portion and a side wall rising from the bottom portion;
a lid member comprising a plate-like bottom portion that is mounted on the inside of the side wall of said main body so that the bottom portion of said lid member closes an opening portion of said main body;
a waterproof sealant that is deposited between said lid member and said main body to seal a gap between an outer periphery of the bottom portion of said lid member and the side wall of said main body; and
an operation section that is provided on said lid member,
wherein a peripheral edge of said operation section and a surface of the bottom portion of said lid member are joined together with said waterproof sealant.

9. The housing for portable communication devices according to claim 2, wherein said lid member is formed of a metal plate.

10. The housing for portable communication devices according to claim 2, wherein:
said lid member comprising the bottom portion and a side wall rising from the bottom portion; and
said waterproof sealant is deposited along a corner portion between the bottom portion and the side wall of said lid member.

11. The housing for portable communication devices according to claim 2, wherein a fluid reservoir in which said waterproof sealant is deposited is formed between said lid member and said main body.

12. The housing for portable communication devices according to claim 2, wherein:
said operation section comprising a switch circuit provided on said lid member, and a flexible sheet laminated on the switch circuit; and
a peripheral edge of the flexible sheet extending outward of the switch circuit is joined to the surface of the bottom portion of said lid member.

13. The housing for portable communication devices according to claim 12, comprising a frame-like reinforcement member that is arranged between the flexible sheet and the surface of the bottom portion of said lid member.

14. The housing for portable communication devices according to claim 2, wherein said waterproof sealant has thixotropy.

\* \* \* \* \*